United States Patent
Johnstone et al.

(10) Patent No.: US 7,248,609 B2
(45) Date of Patent: Jul. 24, 2007

(54) AMPLIFIED BEAM SOURCE

(75) Inventors: Eric S. Johnstone, Redwood City, CA (US); Raymond S. Connell, Jr., American Canyon, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 10/975,246

(22) Filed: Oct. 27, 2004

(65) Prior Publication Data

US 2006/0088074 A1 Apr. 27, 2006

(51) Int. Cl.
*H01S 3/10* (2006.01)

(52) U.S. Cl. .................. 372/25; 372/50.22

(58) Field of Classification Search ............ 372/50, 372/34, 43, 75, 25, 50.22
See application file for complete search history.

(56) References Cited

U.S. PATENT DOCUMENTS

| | | | |
|---|---|---|---|
| 5,103,455 A * | 4/1992 | Eichen et al. ............ | 372/50.22 |
| 5,687,261 A * | 11/1997 | Logan ..................... | 385/24 |
| 5,999,283 A * | 12/1999 | Roberts et al. ............ | 359/108 |
| 6,052,186 A | 4/2000 | Tsai | |
| 6,842,587 B1 * | 1/2005 | McGhan et al. ............ | 398/201 |
| 2002/0146053 A1 * | 10/2002 | Iwai ......................... | 372/75 |
| 2005/0083980 A1 * | 4/2005 | Brick ........................ | 372/43 |

* cited by examiner

*Primary Examiner*—Michael Dung Nguyen (57) ABSTRACT

Directing an input light beam into a laser diode operated at a power below that required for lasing stimulates emissions, resulting in an amplified output beam. A dynamic steering system can focus the input beam onto front face of the laser diode. The steering system optionally includes an optical element mounted solely on piezoelectric actuators. Control signals for the actuators in the steering system control a base position and cause alternating movements of the optical element. A detector measuring optical power leaking from a back face of the laser diode can determine the power of the amplified beam that exits from the front face, and derivatives of the measured power with respect to the alternating movements indicate required adjustments of the base position. A polarizing beam splitter and quarter-wave plate in the path of beams can separate the input and amplified beams.

16 Claims, 4 Drawing Sheets

AMPLIFIED BEAM SOURCE

BACKGROUND

Heterodyne optical interferometers generally use input light beams that include two components of differing frequencies f1 and f2. One type of heterodyne interferometer uses one component (e.g., of frequency f1) in a measurement beam that is reflected from the object being measured and uses the other component (e.g., of frequency f2) in a reference beam. Analysis of the measurement and reference beams (after reflection) can determine a beat frequency that is equal to the frequency difference f1−f2 plus a Doppler shift Δf caused by reflection of the measurement beam from a moving object. The Doppler shift Δf, which may be small relative to the frequency f1 of the measurement beam, can be a significant fraction of the frequency difference f1−f2 and therefore can be precisely determined from the measured beat frequency. However, for an accurate indication of a Doppler shift Δf, the frequency difference f1−f2 in the input heterodyne beam should be greater than the maximum Doppler shift Δf encountered during measurements.

A Zeeman-split laser can provide an input light beam for a heterodyne interferometer. In a Zeeman-split laser, a magnetic field applied axially to a laser cavity creates a difference in the energies of emissions of left and right circularly polarized photons. As a result, the Zeeman-split laser has a gain curve for left circularly polarized light that differs from its gain curve for right circularly polarized light. If the laser cavity has an appropriate length, the Zeeman-split laser thus emits a beam including left circularly polarized light having one frequency and right circularly polarized light having another frequency. Unfortunately, the maximum frequency difference that can be practically created in a Zeeman-split laser is generally less than about 10 MHz, which may be smaller than the Doppler shift caused by reflection from a fast moving object.

An acousto-optic modulator (AOM) can be used with a laser (Zeeman-split or otherwise) to create or increase the frequency difference between the components beams. However, the robustness inherent of current AOM designs and required beam steering optics limit the usefulness of AOMs for creating high power heterodyne beams for precision interferometers.

A high power heterodyne input light beam is particularly important in an interferometer system where available space is limited but simultaneous measurements along many distinct axes are needed. In integrated circuit processing equipment, for example, a single heterodyne beam source may need to provide a heterodyne beam with sufficient power to simultaneously operate up to thirty or more interferometers. A beam source is thus needed that is capable of generating a heterodyne beam with a desired frequency difference and a power level suitable for multiple-axis interferometers.

SUMMARY

In accordance with an aspect of the invention, a beam source for a heterodyne interferometer includes a master laser, a slave laser, and a frequency lock system that controls the slave laser so that an output frequency of the slave laser differs from an output frequency of the master laser by a desired frequency difference. The master laser can be a Zeeman-split laser having two highly stable output frequencies. The first frequency component of the output beam of the Zeeman-split laser forms part of the heterodyne beam. The frequency lock system uses the other frequency component of the output beam of the master laser and a portion of the output beam from the slave laser to create a beat signal that is compared to the reference frequency. The frequency lock system can then dynamically set the operating parameters of the slave laser so that the beat signal has a desired relation to the reference frequency.

In accordance with another aspect of the invention, a light beam such as a heterodyne beam or the separate output beam from a master or slave laser can be amplified by directing the light beam into a laser diode that is operated at a current level below that required for lasing. In one configuration, the input beam enters and the output beam exits through a front facet of the laser diode. In the laser diode, the input beam causes stimulated emissions, resulting in an amplified or augmented output beam power. An anti-reflective coating on the front facet of the laser diode can prevent lasing at low current.

In accordance with yet another aspect of the invention, an active beam steering system precisely focuses a light beam, for example, to direct the beam from a primary laser onto a laser diode that amplifies the beam. The steering system optionally includes a reflector or other optical element mounted on piezoelectric actuators. Three actuators can provide the required angular adjustments of the optical element, and using only the actuators to control the optical element reduces the effect of thermal variations on positioning error when compared, for example, to a system having a fixed pivot. When used with a beam amplifier, control signals for the actuators in the beam steering system can control a base position of the steering element and cause alternating movements of the optical element. The power output from the beam amplifier is measured, and derivatives of the measured power level with respect to the adjustments of the actuator indicate the required adjustment of the base position. In particular, the base position of the steering element can be adjusted so that the derivatives of the energy level are zero and indicate a peak in the output energy.

BRIEF DESCRIPTION OF THE DRAWINGS

Use of the same reference symbols in different figures indicates similar or identical items.

DETAILED DESCRIPTION

In accordance with an aspect of the invention, the power level of a light beam and particularly a heterodyne beam can be enhanced or amplified by directing the beam into a laser diode that is operated at a current level lower than that required for lasing. In operation, an input light beam causes stimulated emission or gain in the laser diode, resulting in a higher power output light beam. In one embodiment, the heterodyne beam source combines beams from two separate lasers into a heterodyne beam. The two lasers can be phase locked to provide a desired frequency difference between the frequency components of the heterodyne beam. The output power of the heterodyne beams or the separate component beams before combination can be amplified using one or more laser diodes operated below the lasing threshold. A dynamic steering system can control the paths of the separate beam components or the combined heterodyne beam as required for incidence on a laser diode.

Figure 1:
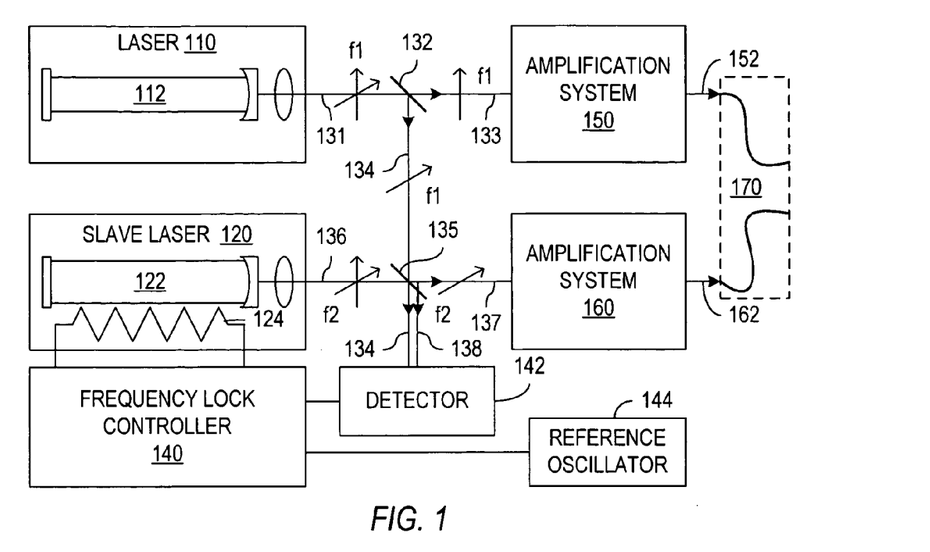
FIG. 1 is a block diagram of a heterodyne beam source in accordance with an embodiment of the invention including phase locked lasers and separate amplification of frequency components.

FIG. 1 is a block diagram of a heterodyne beam source 100 in accordance with an embodiment of the invention. Source 100 includes a pair of lasers 110 and 120, a frequency lock controller 140, amplification systems 150 and 160, and an optical fiber system 170. Lasers 110 and 120 nominally produce output beams 131 and 136 respectively containing light of the desired frequencies f1 and f2 for a heterodyne beam. In the embodiment of FIG. 1, lasers 110 and 120 produce monochromatic beams 131 and 136, but in alternative embodiments of the invention, lasers 110 and 120 can be replaced with heterodyne beam sources.

Laser 110, which is sometimes referred to herein as master laser 110, is preferably a frequency-stabilized laser that provides the desired frequency f1 and a narrow line width. Current HeNe lasers can produce beams having line widths of much less than 1 MHz. In current laser systems, the line width is mainly due to the polarization-amplitude controller, the high finesse of the cavity, and the high voltage power supply (HVPS). Filtering on the HVPS may be able to improve the line width to less than 10 KHz. This improves short-term frequency stability of beam 131 to about 0.02 ppb $-1\sigma$.

Output beam 131 from laser 110 is incident on a beam splitter 132. Beam splitter 132 is preferably a polarizing beam splitter that splits beam 131 into beams 133 and 134. A polarizing beam splitter 132 can provide beam 133, which has the desired frequency f1, with a linear polarization desired for use in the heterodyne beam. Alternatively, with a non-polarizing beam splitter 132, polarizing optical elements (not shown) can give beam 133 the desired polarization for the component of the heterodyne beam having frequency f1. Beam 134, which is for use in locking the frequency f2 of slave laser 120 to the frequency f1 of master laser 110, passes through a second beam splitter 135 to a detector system 142.

Slave laser 120 can be similar or identical to master laser 110 but produces an output beam 136 of frequency f2. Beam splitter 135 splits output beam 136 from laser 120 into beams 137 and 138. Beam splitter 135 is preferably a polarizing beam splitter that provides beam 137, which has frequency f2, with the linear polarization desired for the component of the heterodyne beam having frequency f2. Typically, the polarization of beam 137 is orthogonal to the polarization of beam 133 provided that amplification systems 150 and 160 and fiber optic system 170 preserve the relative polarizations of beams 133 and 137. Beam 138 is for use in locking the frequencies of lasers 110 and 120, and beams 134 and 138 enter detector system 142, which is connected to frequency lock controller 140.

Frequency lock controller 140 controls slave laser 120 as required to precisely achieve a desired frequency difference f1−f2 (e.g., 5 MHz to 200 MHz) between beams 134 and 138. In operation, frequency lock controller 140 receives a beat signal from detector 142 and a reference signal from a reference oscillator 144. The beat signal indicates a frequency difference that detector system 142 measures between beams 134 and 138. Controller 140 compares the beat signal and the reference signal and generates a signal that controls the frequency f2 output from slave laser 120. In one embodiment of the invention, this control signal is a drive signal for a heating element 124 that controls the temperature and therefore the thermal expansion of a laser cavity 122 in laser 120, but other means for controlling the length of laser cavity 122 or the output frequency of slave laser 120 are possible, for example, piezoelectric actuators could be used.

Detector system 142 in an exemplary embodiment of the invention includes a heterodyne photodetector that generates an electronic signal having a frequency equal to the frequency difference f1−f2. In an exemplary embodiment, frequency controller 140 includes a phase/frequency detector (such as used in an RCA CD4046 phase-locked loop device) that receives two inputs, the oscillator output as the reference, and the heterodyne detector output indicating the frequency difference. The CD4046 device produces as error signal that is used in a proportional-integral controller, along with other phase compensation circuitry to produce the voltage signal that drives heater 124 or any other device that controls the cavity length of slave laser 120. Changing the cavity length of slave laser 120 can thus control the frequency difference f1−f2.

Beams 133 and 137, which have respective frequencies f1 and f2, are input to respective amplification systems 150 and 160. Amplified beams 152 and 162 can then be combined into a heterodyne beam or separately coupled to optical fiber system 170 for use in a remote optical system, e.g., interferometer optics.

Figure 2:
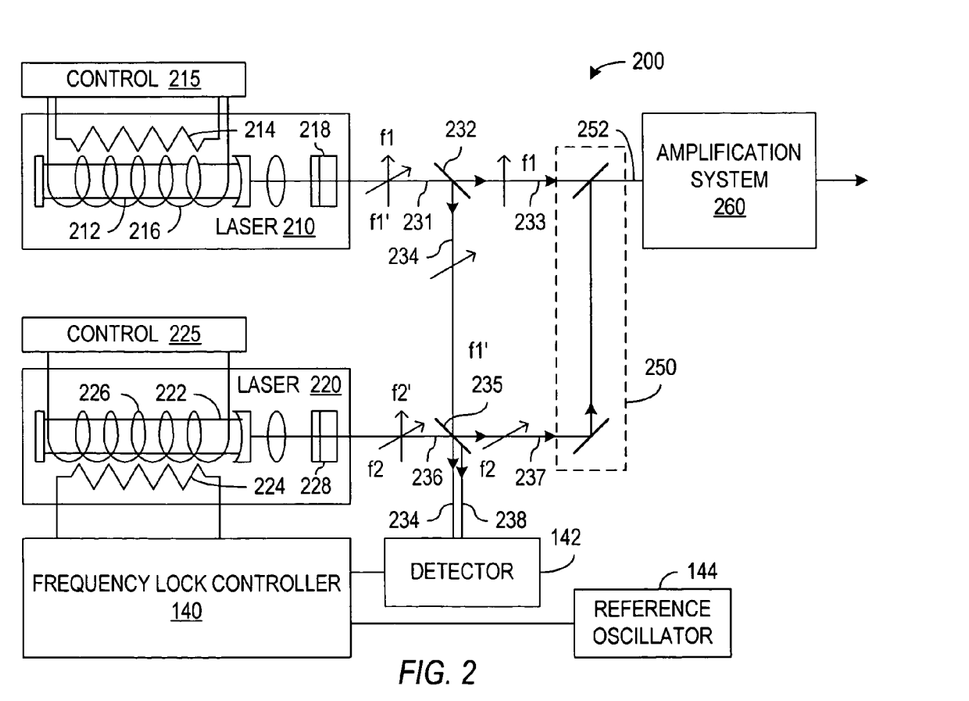
FIG. 2 is a block diagram of a heterodyne beam source in accordance with an embodiment of the invention including phase locked Zeeman-split lasers and amplification of a heterodyne beam.

FIG. 2 illustrates a heterodyne beam source 200 in accordance with an alternative embodiment of the invention. Beam source 200 includes a master laser 210 and a slave laser 220, which are similar to lasers 110 and 120 in beam source 100. However, lasers 210 and 220 are Zeeman-split lasers. In a preferred embodiment of heterodyne beam source 200, master laser 210 or slave laser 220 is a Zeeman-split HeNe laser such as any of the 5517 family of lasers that are commercially available from Agilent Technologies, Inc. Zeeman-split lasers generally produce heterodyne beams in which the frequency of a left circularly polarized component beam has frequency that differs from the frequency of a right circularly polarized component. Polarizing elements 218 or 228 can convert the two circularly polarized components in a Zeeman-split laser 210 or 220 into two orthogonal linear polarization components having polarizations along selected axes. As a result, heterodyne beam 231 contains a first linearly polarized component beam with frequency f1 and a second orthogonal linearly polarized component beam with frequency f1'. Heterodyne beam 236 similarly contains a first linearly polarized component beam with frequency f2 and a second orthogonal linearly polarized component beams with frequency f2'.

In the illustrated embodiment, each Zeeman-split laser 210 or 220 includes a heating element 214 or 224 or other device that controls the length of an associated laser cavity 212 or 222 according to an applied signal from a controller 215 or 140. Adjustment of the current through a coil 216 or 226 adjusts the magnitude of the applied axial magnetic field that causes Zeeman splitting of energy levels in the lasing material in laser cavity 212 or 222. Controller 215 of master laser 210 can further include a feedback system that controls coil 216 to keep a measured frequency difference f1−f1' at a desired level and can also control heating element 214 as required to provide the desired frequency f1. Slave laser 220 similarly can include a feedback system 225 that controls coil 226 to keep frequency difference f2−f2' at a desired level, but frequency lock controller 140 dynamically controls heating element 224 to ensure the frequency f2 provides the desired frequency difference f1−f2.

Beam 231 from master laser 210 is incident on a polarizing beam splitter 232 that splits beam 231 according to polarization into beams 233 and 234. Beam 233, which has frequency f1 and the desired linear polarization corresponding to frequency f1 in the heterodyne beam, is directed for use in the output heterodyne beam. Beam 234, which has frequency f1', is directed through polarizing beam splitter 235 for use in frequency locking.

Beam 236 from slave laser 220 is incident on polarizing beam splitter 235, which splits beam 236 according to polarization into beams 237 and 238. Beam 237, which is directed for use in the output heterodyne beam, has the linear polarization corresponding to frequency f2, and beam 234, which frequency locking circuitry uses, has the linear polarization corresponding to frequency f2'.

Polarizing beam splitter 235 combines beams 234 and 238 and provides the combined beam to detector system 142. Detector system 142 measures a frequency difference (or beat frequency) f1−f2' from the combined beam and generates an electronic beat signal. Frequency lock controller 140 compares the beat signal from detector system 142 to a reference signal from oscillator 144 and generates a control signal for heating element 224. The length of laser cavity 222 can thus be controlled so that beat frequency f1'−f2' has a desired relation with (e.g., is equal to) a reference frequency. The dynamic control of the beat frequency f1'−f2' and of the Zeeman-split frequency differences f1−f1' and f2−f2' maintains a desired frequency difference f1−f2 in the output heterodyne beam. In one embodiment, frequencies f1, f1', f2, and f2' satisfy the condition f1>f1'>f2'>f2 to achieve a large frequency difference f1−f2, but other selections of the relative size of frequencies f1, f1', f2, and f2' could alternatively be used.

In beam source 200, a beam combiner 250 combines beams 233 and 237 from polarizing beam splitters 232 and 235 before a combined beam 252 is input to an amplification system 260. Amplification system 260 can be substantially identical to amplification system 150 or 160, and in the exemplary embodiment, amplification system 260 includes a laser diode operated at a current below the lasing threshold. However, amplification system 260 receives combined beam 252 and thus simultaneously amplifies both frequency/polarization components.

In accordance with an aspect of the invention, each amplification system 150, 160, or 260 contains a laser diode. Laser diodes are sold commercially as optical oscillators, but such laser diodes can still exhibit considerable optical gain even when operated below the threshold current, i.e., at currents below the point where the intrinsic gain is equal to the cavity loss (including the reflectivity of the facet mirrors). Further improvement of the gain for beam amplification can be achieved using an antireflective coating on a front face of the laser diode, allowing the active medium in the laser diode to be pumped with greater current before lasing occurs.

The active medium in a laser diode generally radiates incoherently when the active medium is pumped below threshold for self-sustained oscillation. In particular, lasing will not occur if the feedback is insufficient, i.e., when the beam energy loss/per pass exceeds the single pass gain. The energy loss of a laser cavity includes medium loss (such as scattering) mirror absorption, and loss resulting from output light transmission. Even when loss from transmission out of the laser diode makes a population inversion insufficient to maintain lasing, a photon produced by spontaneous emission in the laser diode will still be amplified by stimulated emission of more photons. An input beam is another source of photons that can induce stimulated emissions from the medium, and if the input beam provides a sufficiently large number of photons, amplified spontaneous emission (ASE) is less because amplification of the input beam extracts most of the gain of the medium. As a result, the amplified beam resulting from an input beam will predominantly be coherent with the input beam and have the same wavelength and polarization characteristics as the input beam.

The laser diodes in amplification systems 150, 160, and 260 operate at current levels lower than the thresholds normally required for lasing and therefore do not produce laser beams having the frequencies characteristic of the laser diodes. However, an input beam, which is preferably focused down to the single mode waveguide of the laser diode, is incident on the laser diode and causes stimulated emission in the laser diode. As a result, the output beam has the same frequency and polarizations characteristics of the input beam but has more power.

Figure 3:
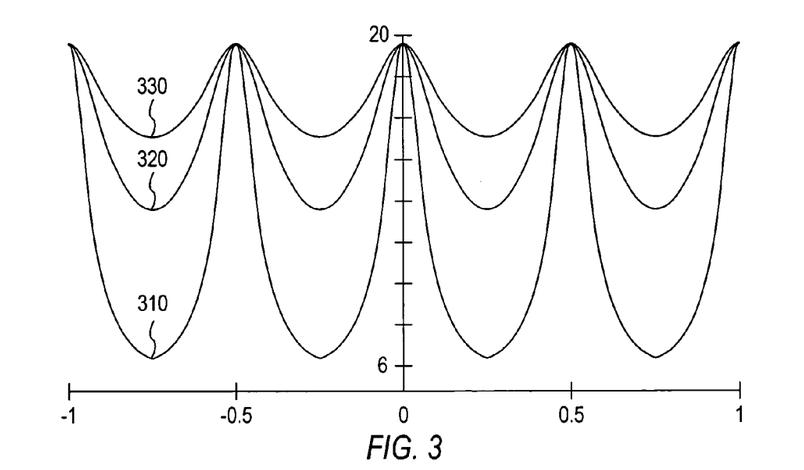
FIG. 3 shows plots of the gain of a laser diode having selected front facet reflectivity when the laser diode is operated below a lasing threshold.

FIG. 3 shows plots 310, 320, and 330 illustrating the wavelength sensitivity of the gain profile of laser diodes with the front facets having reflectivities of 5%, 0.5%, and 0.1%, respectively and a back facet having a reflectivity of 90%. The low reflectivities that provide more gain but no lasing may require special treatment, e.g., an anti-reflective (AR) coating, on the front facet of the laser diode. For light amplification, an input beam enters through the front facet of the laser diode causing an amplified beam to reflect from the back facet and exit from the front facet of the laser diode. As illustrated in FIG. 3, lowering the reflectivity of the front facet reduces the variation of the gain as a function of frequency. Minimal gain variation with frequency is desirable because a large modulation in the gain curve increases the sensitivity of the gain to changes in temperature and diode current. Some form of temperature control is generally needed to prevent gain fluctuations due to changes in ambient temperature when a net worst-case gain of 25 dB is required. The temperature control requirements generally depend on the quality of the anti-reflection coating on the front facet of the laser diode.

Fluorescence from the pn junction of the laser diode due to the amplified spontaneous emission (ASE) can introduce noise fluctuations into the power and frequency of the output beam. The emission bandwidth (and the gain bandwidth) of a typical laser diode is currently about 10 nm (or about $7.4 \times 10^{12}$ Hz). The detection bandwidth is currently about 20 MHz. Therefore, the noise power in the pass band of the system is about $P_{ASE}*20 \times 10^6$ Hz/$7.4 \times 10^{12}$ Hz or $P_{ASE}*2.67 \times 10-6$, where $P_{ASE}$ is the optical power due to amplified spontaneous emissions. The phase noise in radians will be about $0.001634013464*\sqrt{P_{ASE}/P_{SIG}}$, where $P_{SIG}$ is the emitted optical power of the amplified input signal. Thus, to provide phase noise that is less than $0.001*2\pi$, the ratio $P_{ASE}/P_{SIG}$ should be less than about 14.7. Further, power $P_{ASE}$ should be less than about 0.2 $P_{SIG}$ for reasons associated with saturation of the system receiver photodetector.

To avoid selecting laser diodes and to achieve maximum gain available at room temperature for a batch of laser diodes, the diodes can be cooled (e.g., to 0° C.). However, humidity should be controlled to avoid condensation over the entire thermal range intended for operation of the laser diodes. Humidity control is also desirable for embodiments of the invention employing piezoelectric transducers in beam steering optics because humidity can significantly shorten the useful lifetime of the piezoelectric transducers. Currently available piezoelectric devices have a predicted lifetime is about 26,000 hours if operated at about 60% relative humidity, but the useful lifetime may be extended to more than 300,000 hours if the relative humidity is kept below about 35%.

Figure 4:
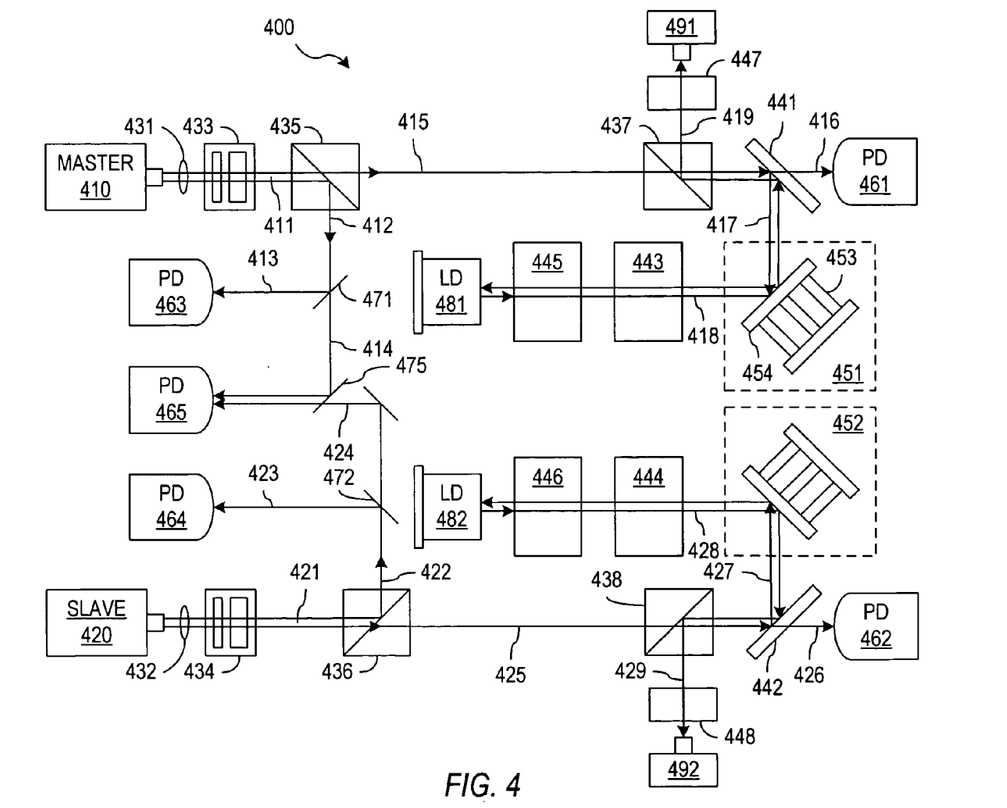
FIG. 4 is a block diagram of a heterodyne beam source in accordance with an embodiment of the invention with dynamic beam positioning for amplification.

In accordance with a further aspect of the invention, a dynamic beam steering system can position the heterodyne beam or a separate frequency/polarization component beam on a laser diode that amplifies the optical power of the beam. FIG. 4 shows a heterodyne beam source 400 in accordance with an embodiment of the invention including dynamically controlled beam steering systems 451 and 452. Beam source 400 includes a master laser 410 that in an exemplary embodiment of the invention is a Zeeman-split helium-neon laser. The output beam from master laser 410 includes two circularly polarized component beams of opposing rotation and slightly different frequencies f1 and f1'. A collimating lens 431 collimates the light beam from master laser 410 to a 1 mm $1/e^2$ diameter, and quarter-wave and half-wave plates 433 resolve the two circularly polarized components into orthogonal linear polarizations that are respectively parallel and perpendicular to the page of FIG. 4. FIG. 4 shows the polarization components (e.g., of heterodyne beam 411) offset from each other to better illustrate differences in optical paths, but in an actual system, the polarization components would be substantially collinear with each other in the combined beams.

A polarizing beam splitter 435 splits the output beam 411 of master laser 410 into a beam 415 having frequency f1 and a first linear polarization and a beam 412 having frequency f1' and a second linear polarization that is perpendicular to the first polarization. Beam 412 is directed to a detector system used for dynamic control of master laser 410 and slave laser 420.

Beam 415 is directed to an amplifying system before being output through an optical fiber coupler 491. For amplification, beam 415 is directed through a polarizing beam splitter 437 that is oriented so that the beam 415 has the transmitted polarization. Two polarizing beam splitters 435 and 437 having aligned polarization axes ensure a high purity of polarization (and therefore frequency) separation. A turning mirror 441, which is preferably about 99% reflecting and about 1% transmitting, extracts a sample 416 of the beam 415 for measurement by a detector 461. A reflected beam 417 from turning mirror 441 enters a steering system 451 that directs beam 417 through a quarter-wave plate 443 and a collimating lens 445 into a laser diode 481.

Laser diode 481 operates at a current below the threshold for lasing and emits an amplified beam 418 having substantially the same frequency and polarization as did the beam that entered laser diode 481. Amplified beam 418 propagates through lens 445 and a π/4 Faraday rotator set 443 before returning to steering system 451. As a result of the two passes through and π/4 Faraday rotator 443, amplified beam 418 returns to steering system 451 with a linear polarization that is perpendicular to the original polarization of beam 417. Accordingly, after passing through steering system 451 and reflecting from turning mirror 441, amplified beam 418 reflects from polarizing beam splitter 437, and enters optical fiber coupler 491 through collimating lens 447.

Slave laser 420 similarly produces a heterodyne output beam including circularly polarized components of respective frequencies f2 and f2'. A collimating lens 432 and quarter-wave and half-wave plates 434 resolve the output beam from slave laser 420 into a collimated heterodyne beam 421 including a first linearly polarized component with a frequency f2 and a second linearly polarization component having a frequency f2'. Polarizing beam splitter 436 splits heterodyne beam 421 according to polarization into beams 422 and 425. Beam 422 has frequency f2' and is directed to the detector system used for dynamic stabilization of master laser 410 and slave laser 420.

Beam 425 is directed to an amplifying system before being output through an optical fiber coupler 492. For amplification, beam 425 is directed through a polarizing beam splitter 438 to a turning mirror 442, which is preferably about 99% reflecting and about 1% transmitting. A detector 462 measures a sample beam 426 that turning mirror 442 extracts from beam 425. A reflected beam 427 from turning mirror 442 enters a steering system 452 that directs beam 427 through a quarter-wave plate 444 and a collimating lens 446 to a laser diode 482.

Laser diode 482 operates at a current below the threshold for lasing and emits an amplified beam 428. Amplified beam 428 propagates through lens 446 and a π/4 Faraday rotator 444 before returning to steering system 452. Upon entering steering system 452, beam 428 has a polarization that is perpendicular to the original polarization of beam 427 as a result of the two passes through a π/4 Faraday rotator 444. Accordingly, after passing through steering system 452 and reflecting from turning mirror 442, beam 428 reflects from polarizing beam splitter 438, and enters optical fiber coupler 492 through collimating lens 448.

Heterodyne beam source includes detectors 461 to 465 for monitoring of beam characteristic to ensure that the output beams 419 and 429 have the desired characteristics. In particular, detector 465 is used to interfere one polarization from master laser 410 and one polarization from slave laser 420, so that the photo-generated current from detector 465 exhibits the frequency difference between the two lasers. A frequency lock circuit (not shown) can use the signal from detector 465 to control the cavity length of slave laser 420. such that the frequency difference of the measured polarization components is equal to the reference frequency such as from crystal oscillator 144 in FIG. 2.

Photo-generated currents from detectors 461 and 463 are proportional to the power of respective polarization components output from master laser 410. Signals from detectors 461 and 463 can thus be used to continuously monitor the power in each polarization component to provide a sense of the total power and to determine an error signal for control the frequency of master laser 410. Detector 462 and 464 similarly measure the power in the polarization components output from slave laser 420 and can be used to determine the total power. However, these measurements of slave laser 420, are not be used to control the cavity length of slave laser 420 since the cavity length in slave laser 420 is selected to achieve a desired frequency difference from master laser 410.

Steering systems 451 and 452 direct beams 417 and 427 onto the front facets of respective laser diodes 481 and 482, and direct the returned amplified beams 418 and 428 onto paths to respective fiber couples 491 and 492. In an exemplary embodiment, optical fiber couplers 491 and 492 are for single mode optical fibers at 632.8 nm, which have a natural mode diameter of about 4 μm, and laser diodes 481 and 482 similarly have an optical mode 4 μm×0.8 μm. Alignment with laser diode 481 or 482 is typically about 4 to 5 times more difficult than alignment to a fiber because the numerical aperture of the typical diode waveguide is about 0.5 and the numerical aperture of a single mode waveguide is about 0.1). These tolerances permit a small margin for error in the beam direction. Accordingly, master laser 410 and slave laser 420 should have minimal the tube motion, an active alignment system should be implemented, and/or the interferometer optics must accommodate pointing instability. An example of an active alignment process using steering systems 451 and 452 is described further below.

Figure 5:
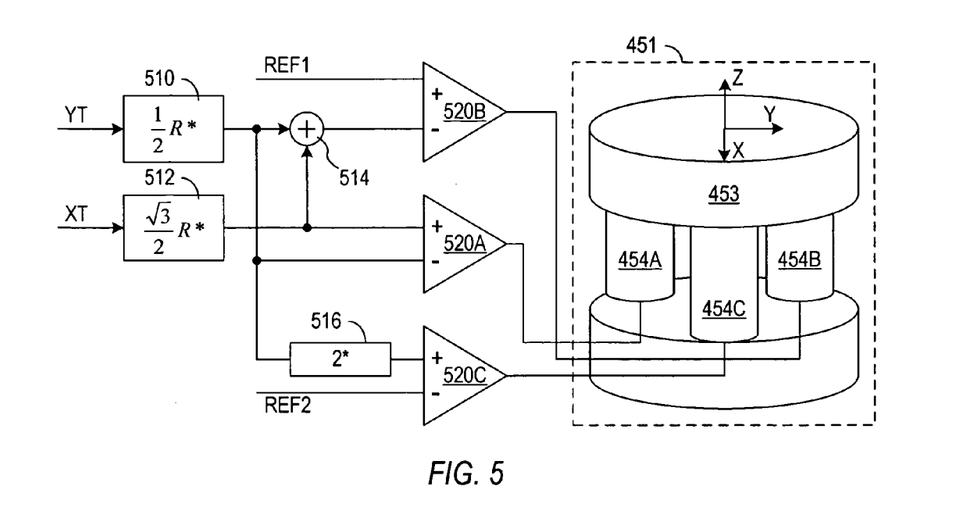
FIG. 5 shows an actuator system for beam steering in accordance with an embodiment of the invention.

In an exemplary embodiment of the invention, each steering system 451 or 452 includes a plane mirror 453 mounted on three piezoelectric stack actuators 454A, 454B, and 454C as shown in FIG. 5. Three-piezoelectric actuators 454 give mirror 453 three degrees of freedom, e.g., tilting angles θx and θy about X and Y axes and vertical translation Tz along a Z-axis. Generally, tilting of mirror 453 may be sufficient for beam steering for incident on a laser diode.

A possible candidate for actuators 454A, 454B, and 454C is the NEC AE203D04, which can deliver 3 μm displacement with 100 V drive. An actuator displacement of 3 μm corresponds to about ⅗ mrad of tilt if actuators 454 are about 5 mm apart. The steering system with actuators in this configuration could thus correct for a 1.2 mrad change in beam direction. For a laser such as the 5517X HeNe laser, an angular variation of the output beam over a temperature range of 10° C. is less than 1.2 mrad. Accordingly, exemplary embodiments of steering systems 451 and 452 have more than enough capability to compensate for angular variation in the directions of the output beams from lasers 410 and 420.

FIG. 5 also illustrates how control signals XT and YT that are proportional to the desired tilt angles θx and θy can be applied to high voltage amplifiers 520A, 520B, and 520C to respectively drive piezoelectric actuators 454A, 454B, and 454C. In FIG. 5, actuators 454A, 454B, and 454C are equally spaced about a circular perimeter of radius R. Using a co-ordinate system with its origin at the center of mirror 453, actuator 454 is on the X-axis a distance R from the origin. Actuators 454A and 454B are each a distance $$\frac{\sqrt{3}}{2}R$$

from the X-axis and control rotation of mirror 453 about the X-axis. For control of tilt angle θx, a scaling device 512 scales signal XT by a factor proportional to the distance of actuators 454A and 454B from the X-axis, and amplifiers 520A and 520B apply the scaled signal positively to actuator 454A and negatively to actuator 454B, causing rotation of mirror 453 about the X-axis. For control of tilt angle θy, amplifiers 520A and 520B apply a first scaled version of signal YT negatively to actuators 454A and 454B, and amplifier 520C applies a second scaled version of signal YT positively to actuator 454C, causing rotation about the Y-axis. Scaling devices 510 and 516 scale signal YT to reflect that the Z component of the distance of actuator 454C from the origin is twice the Z component of the distance between the origin and actuator 454A or 454B and further to match the scaling of signal YT with the scaling of signal XT. An analog adder 514 combines the scaled signals for simultaneous control of tilt angels θx and θy.

In an active beam steering process in accordance with one embodiment of the invention, control signals XT and YT for tilt angles θx and θy each include a slowly varying "DC" term and an oscillating "AC" term. The DC term $XT_{DC}$ or $YT_{DC}$ adjusts the orientation of mirror 453 as required to compensate for variations in the direction of the beam and establishes a base mirror orientation that corresponds the highest power amplification from the laser diode. The AC term provides oscillations (e.g., sinusoidal or pseudorandom) about the base orientation and is used in adjusting the base orientation to improve power output. For example, the AC term $XT_{AC}$ or $YT_{AC}$ for each control signal XT and YT can oscillate at about 20 Hz, with the AC signal $XT_{AC}$ for tilt angle TX being about 90° out of phase with respect to the AC signal $YT_{AC}$ for tilt angle θx. More generally, the response time of the detector system monitoring the power output from the laser diode limits the frequency of the AC signal. An AC frequency of 20 Hz is good value in a system where 50 Hz is the maximum amplitude variation frequency that detectors can follow because a 20 Hz tilt oscillation generates a 40 Hz amplitude variation in the measured power when the optimal alignment position is reached.

Figure 6:
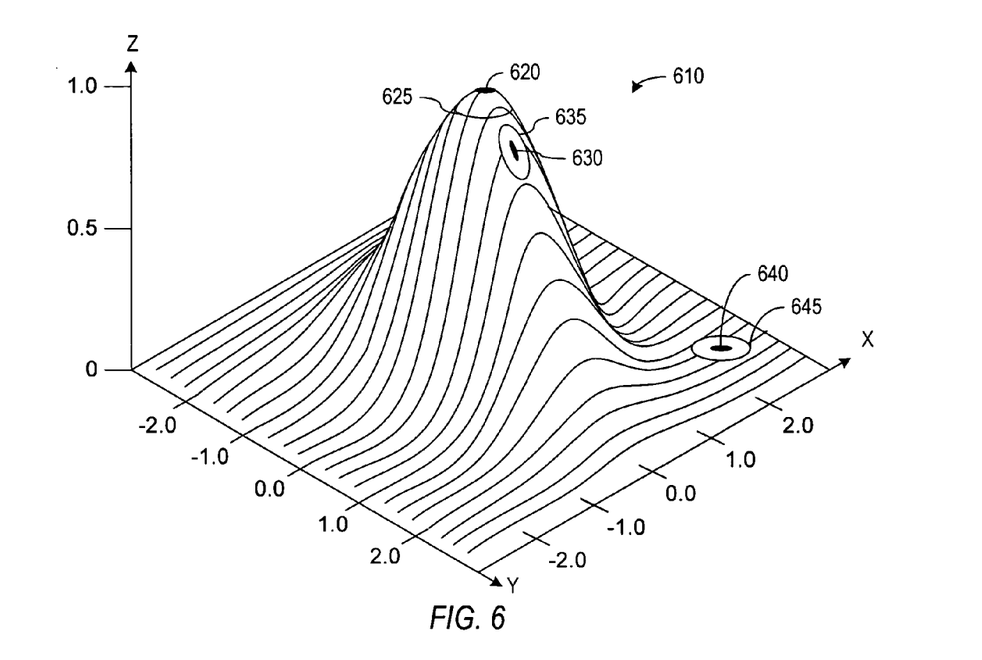
FIG. 6 shows a plot of coupling efficiency and illustrates a dynamic steering process in accordance with an embodiment of the invention.

FIG. 6 represents a plot 610 of the coupling efficiency of a Gaussian mode laser beam power distribution with a Gaussian mode waveguide of the laser diode. Generally, optical energy that is not coupled into the mode of the laser diode waveguide is absorbed instead of being amplified because population inversion in the laser diode only exists in the region near the optical waveguide. The coupling efficiency for Gaussian light distribution and laser waveguide thus has the Gaussian form illustrated in FIG. 6. The actual coupling efficiency into the laser diode can be measured with a photodetector (not shown) that sits behind and measures the optical energy leaking through the back facet of the laser diode.

An active alignment process attempts to set the DC components $XT_{DC}$ and $YT_{DC}$ of the control signals XT and YT for tilt angles θx and θy to levels that achieve a maximum power output. The DC components $XT_{DC}$ and $YT_{DC}$ thus ideally correspond to a mirror orientation that achieves the maximum coupling efficiency corresponding to point 620.

The AC terms apply small perturbations to the mirror tilt angles θx and θy. As the tilt angle changes, the coupling changes because the position of the beam spot with respect to the centroid of the mode field of the laser diode changes. When the DC terms are set to correspond to peak point 620, the movement of the mirror corresponds to circle or ellipse 625 centered on point 620 if the AC components $XT_{AC}$ and $YT_{AC}$ for tilt angles θx and θy then vary sinusoidally and are out of phase by 90° (or π/2 radians). The coupling efficiency at any point on ellipse 625, which is centered on peak point 620, is equal to the coupling efficiency at a directly opposite point on ellipse 625. Accordingly, a measurement of the coupling efficiency (e.g., optical power) will be constant or will vary with twice the frequency of the AC terms (e.g., 40 Hz), but fluctuations at the frequency of the AC terms will be nearly zero.

Point 630 illustrates a point corresponding to a DC error where the DC signal is near but not at the ideal level. In this case, the AC terms when 90° out of phase with each other cause a fluctuation in the power measurements corresponding to ellipse 635. The power measurement thus exhibits a clear variation at frequency of the AC terms (e.g., 20 Hz) as the tilt angles move toward or away from the ideal angles θx and θy. The phase of the power measurement signal or the tilt angles at peak power for ellipse 635 indicates the slope of plot 610 at point 630 and can guide a correction loop to move the DC signal back towards the equilibrium (and maximum) coupling point.

Sinusoidal perturbation as described above is a viable means to detect the derivative of the amplification but suffers from the frailty of being susceptible to background vibrations near a nutation frequency of steering system. An alternative technique employs pseudo-random perturbation that is not tied to any particular frequency. However, the overall frequency content (i.e., spectral density) of the pseudo-random perturbation should not exceed the requirements for this system, which is about 50 Hz in a typical implementation. From knowledge of the pseudo-random perturbation, the system can still correlate the change in the measured coupling to an ideal waveform, and determine the required change in the DC signal.

A point 640 on plot 610 illustrates a large DC error. At point 640, the slope change with position (i.e., the curvature of plot 610) has changed sign and now a feedback loop that worked for AC variations about point 630 may not be able to drive the mirror from point 640 to the optimum point 620. However, coupling efficiency plot 610 is a Gaussian and therefore has a natural logarithm that is a quadratic function in X and Y, and the gradient of the natural logarithm is directly proportional to X and Y. Thus, a feedback loop that drives the DC components of tilt angles θx and θy based on the gradient of the natural logarithm of the measured power should drive the DC terms to the maximum (zero slope) so that no points of instability (due to curvature change) exist.

Figure 7:
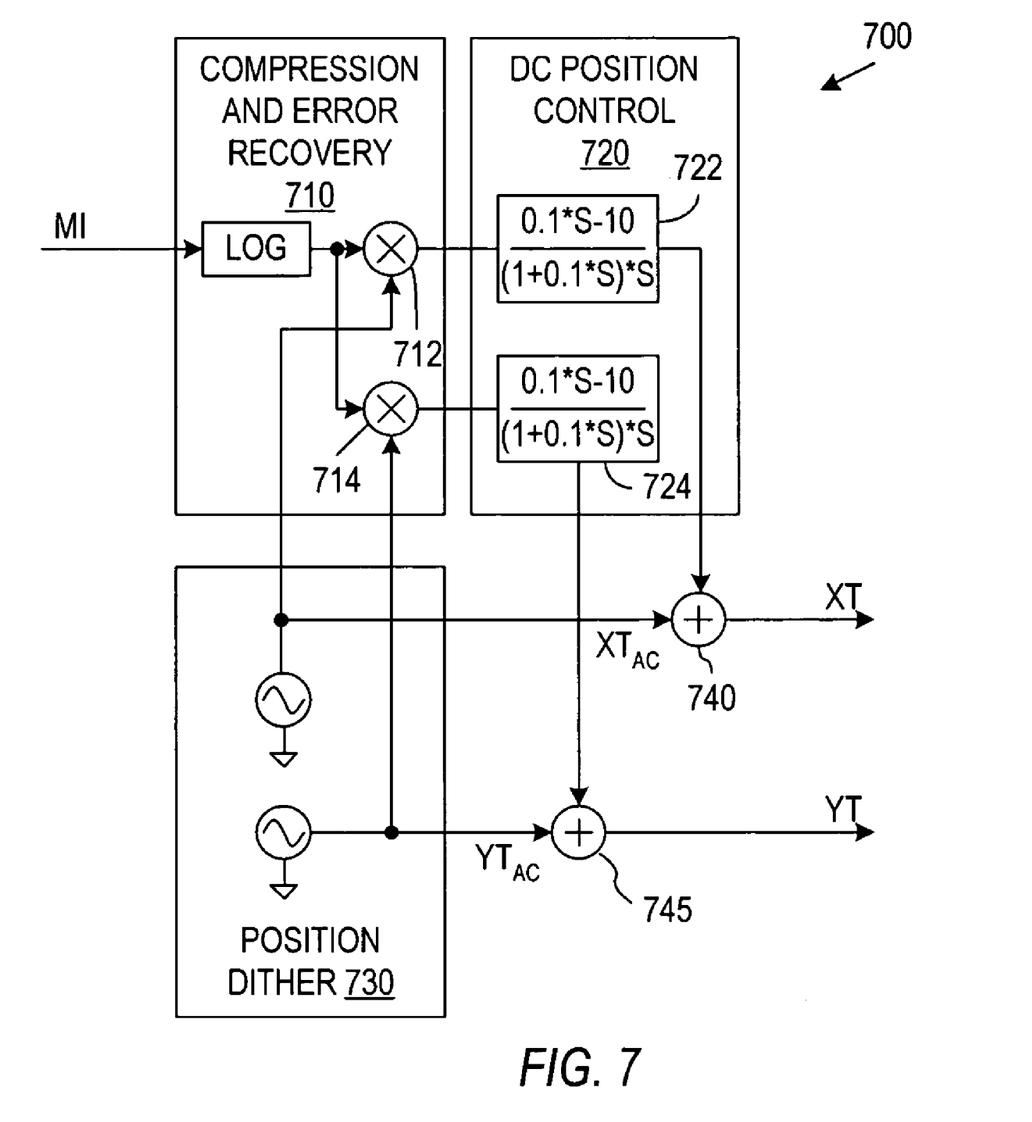
FIG. 7 is a block diagram illustrating the dynamic control of a beam steering system in accordance with an embodiment of the invention.

FIG. 7 illustrates a control loop 700 for a beam steering system in accordance with an embodiment of the invention. Control loop 700 includes a compression and error recovery unit 710, a DC position control unit 720, and a position dither unit 730. The measured power signal MI is input to compression and error recovery unit 710 and is logarithmically compressed and then mixed with the in-phase (x-dither) signal $XT_{AC}$ and out of phase (y-dither) signal $YT_{AC}$. Position dither unit 730 creates the AC component signals $XT_{AC}$ and $YT_{AC}$, which are added to the outputs of DC position control 720. The voltages used to excite the piezoelectric actuators are proportional to the signal XT and YT at the output from summing nodes 740 and 745. AC component signals $XT_{AC}$ and $YT_{AC}$ thus perturb the position of the beam relative to the laser diode. This may change the value of the overlap integral and therefore the measured power signal MI. DC position control unit 720 serves to filter out all other harmonics (e.g., a 40 Hz signal corresponding to signal $XT_{AC}$ or $YT_{AC}$) and integrate the error until the effect of the disturbance is brought to zero.

Theoretically, measured signal MI is of the form of $P(x,y)+m_x(t)\partial P/\partial x+m_y(t)\partial P/\partial y$ where x and y are the beam position coordinates, P is the light power, and $m_x$ and $m_y$ are the modulation inputs resulting from signals $XT_{AC}$ and $YT_{AC}$. After multipliers 712 and 714, the signal in the x channel is $P(x,y)*m_x(t)+m_x(t)^2\partial p/\partial x+m_x(t)*m_y(t)\partial P/\partial y$, and the signal in the y channel is $P(x,y)*m_y(t)+m_x(t)*m_y(t)*\partial P/\partial x+m_y(t)^2\partial P/\partial y$. DC position control 720 contains filters (represented by the Laplace transform blocks 722 and 724) that provide a low pass filter followed by a proportional and integral (PI) controller. Nominally, after the low pass filters, the signal in the x channel is $\alpha\partial P/\partial x$, and the signal in the y-channel is $\alpha\partial P/\partial y$, which are the derivatives of the signal being simultaneously minimized. PI controller drives the derivatives to zero, which is achieved at an extremum. If the initial error is small enough, this extremum will be a maximum. The DC error is integrated out, and the AC component may experience a phase shift, which can induce crosstalk between the channels XT and YT, but any error produced becomes DC error and is integrated out. The maximum phase shift can be limited to less than 90° to ensure stability.

The photo-detector measuring the amplified optical power can be implemented with a DC coupled output because the frequencies are low (e.g., about 20 Hz). The rest of the system (the mixers, the adders, the controllers and the "sine" wave oscillators) is easily implemented as a processor (such as the 32-bit TI-32050x family of digital signal processor devices). Such processors have the bandwidth to accommodate multiple voice channels and would therefore have no problem handling a sampling rate on the order of about 1 KHz. If a processor is used, an anti-aliasing filter should be implemented in the photodetector amplifier. The low frequencies of operation are ideal for DSPs because no large capacitors are required in the filters.

Although the invention has been described with reference to particular embodiments, the description is only an example of the invention's application and should not be taken as a limitation. Various adaptations and combinations of features of the embodiments disclosed are within the scope of the invention as defined by the following claims.

What is claimed is:

1. A beam source comprising:
   a first laser that produces a first beam;
   a first laser diode in a path of the first beam, wherein the first laser diode operates at a power below a lasing threshold of the first laser diode and produces a first amplified beam having a power greater than that of the first beam as a result of amplified spontaneous emissions in the first laser diode;
   a second laser that produces a second beam; and
   a detector system that measures a frequency difference between light in the first beam and light in the second beam; and
   a control circuit control circuit that controls operating parameters of the second laser as required to maintain a desired value for the frequency difference.

2. The beam source of claim 1, further comprising a second laser diode in a path of the second beam output, wherein the laser diode operates at a power below a lasing threshold of the second laser diode and produces a second amplified beam having a greater power than the second beam as a result of amplified spontaneous emissions in the second laser diode.

3. The beam source of claim 1, wherein the first laser comprises a Zeeman-split laser.

4. The beam source of claim 3, further comprising a first polarizing beam splitter positioned and oriented to split the first beam into a first component beam having a first frequency and a first linear polarization and a second component beam having a second frequency and a second linear polarization, wherein the first polarizing beam splitter directs the first component beam toward the first laser diode and directs the second component beam to the detector system.

5. The beam source of claim 4, wherein the second laser comprises a Zeeman-split laser.

6. The beam source of claim 5, further comprising a second polarizing beam splitter positioned and oriented to split the second beam into a third component beam having a third frequency and the second linear polarization and a fourth component beam having a fourth frequency and the first linear polarization, wherein the second polarizing beam splitter directs the third component beam toward the second laser diode and directs the fourth component beam to the detector system.

7. A beam source comprising:
a first laser that produces a first beam;
first laser diode in a path of the first beam, wherein the first laser diode operates at a power below a lasing threshold of the first laser diode and produces a first amplified beam having a power greater than that of the first beam as a result of amplified spontaneous emissions in the first laser diode;
a detector that measures the first amplified beam; and
a beam steering system that dynamically steers the first beam as required to optimize the power of the first amplified beam.

8. The beam source of claim 7, wherein:
the first beam is incident on a front facet of the first laser diode;
the first amplified beam exits from the front facet of the first laser diode; and
the detector is position to measure light that exits from a back facet of the laser diode.

9. The beam source of claim 7, wherein the beam steering system dynamically steers the first beam to control incidence on the first laser diode as required to optimize the power of the first amplified beam.

10. A beam source comprising:
a first laser that produces a first beam;
a first laser diode in a path of the first beam, wherein the first laser diode operates at a power below a lasing threshold of the first laser diode and produces a first amplified beam having a power greater than that of the first beam as a result of amplified spontaneous emissions in the first laser diode;
a polarizing beam splitter through which the first beam passes on the path to the first laser diode; and
a quarter-wave plate between the polarizing beam splitter and the first laser diode, wherein
the first beam is incident on a front facet of the first laser diode after passing through the quarter-wave plate; and
the first amplified beam exits from the front facet of the first laser diode and passes through the quarter-wave plate and back to the polarizing beam splitter.

11. The beam source of claim 10, further comprising:
a second laser diode in a path of a second beam, wherein the second laser diode operates at a power below a lasing threshold of the second laser diode and produces a second amplified beam having a power greater than that of the second beam; and
a system for combining the first amplified beam and the second amplified beam to produce a heterodyne beam.

12. A method for producing a heterodyne beam suitable for use in an interferometer, comprising:
generating a first beam having a first frequency;
operating a first laser diode at a power below a lasing threshold of the first laser diode;
directing the first beam into the first laser diode;
generating a second beam having a second frequency;
operating a second laser diode at a power below a lasing threshold of the second laser diode;
directing the second beam into the second laser diode; and
combining a first amplified beam that emerges from the first laser diode with a second amplified beam that emerges from the second laser diode to form the heterodyne beam.

13. The method of claim 12, wherein:
amplified spontaneous emissions in the first laser diode cause the first amplified beam to have a power greater than that of the first beam; and,
amplified spontaneous emissions in the second laser diode cause the second amplified beam to have a power greater than that of the second beam.

14. The method of claim 12, wherein the first amplified beam has a power greater than that of the first beam as a result of amplified spontaneous emissions in the first laser diode, and the second amplified beam has a power greater than that of the second beam as a result of amplified spontaneous emissions in the second laser diode.

15. A method for producing a heterodyne beam suitable for use in an interferometer, comprising:
generating a first beam having a first frequency;
operating a first laser diode at a power below a lasing threshold of the first laser diode;
directing the first beam into the first laser diode; and
using a first amplified beam that emerges from the first laser diode as a component of the heterodyne beam, wherein directing the first beam into the first laser diode comprises:
monitoring a power level of the first amplified beam; and
operating a dynamic steering system that directs the first beam into the laser diode to maximize the power level of the first amplified beam.

16. The method of claim 15, where operating the dynamic steering system comprises:
applying a control signal made up of a DC component and an AC component to the dynamic steering system; and
adjusting the DC component according to variations in the power level.

* * * * *